United States Patent [19]
Kamo et al.

[11] Patent Number: 5,856,909
[45] Date of Patent: Jan. 5, 1999

[54] HEAT-RADIATION STRUCTURE OF ELECTRIC UNIT BOX

[75] Inventors: Hiroaki Kamo, Shizuoka; Kazuhiro Kawachi, Aichi, both of Japan

[73] Assignee: Yazaki Corporation, Tokyo, Japan

[21] Appl. No.: 842,535

[22] Filed: Apr. 15, 1997

[30] Foreign Application Priority Data

Apr. 19, 1996 [JP] Japan .................................. 8-098698

[51] Int. Cl.⁶ ................................................ H05K 7/20
[52] U.S. Cl. ............................................................ 361/695
[58] Field of Search .................................. 361/688, 690, 361/694–696, 724

[56] References Cited

U.S. PATENT DOCUMENTS

| 4,646,202 | 2/1987 | Hook et al. ............................. | 361/382 |
| 5,274,530 | 12/1993 | Anderson ................................ | 361/694 |
| 5,493,474 | 2/1996 | Schrohowsky et al. ................ | 361/695 |

FOREIGN PATENT DOCUMENTS

| 28 44 672 | 4/1980 | Germany . |
| 31 21 906 | 4/1982 | Germany . |
| 3-83419 | 8/1991 | Japan . |
| 3-104023 | 10/1991 | Japan . |
| 3-127428 | 12/1991 | Japan . |
| 6-217438 | 8/1994 | Japan . |
| 6-62724 | 9/1994 | Japan . |
| 1341294 | 12/1973 | United Kingdom . |
| 2 202 681 | 9/1988 | United Kingdom . |

*Primary Examiner*—Gregory D. Thompson
*Attorney, Agent, or Firm*—Sughrue, Mion, Zinn, Macpeak & Seas, PLLC

[57] ABSTRACT

A heat-radiation structure of an electronic-unit box in which an air layer is formed between a primary peripheral wall of the electronic-unit box and a secondary peripheral wall located inside the primary peripheral wall, and an electronic unit is received inside the secondary peripheral wall, an air intake and an air outlet are provided in a box body so as to communicate with the air layer, and air interrupting walls are provided in a shorter peripheral-distance-side flow path of the air layer between the air intake and the air outlet so that cooling air passes through a longer peripheral-distance-side flow path of the air layer from the air intake to the air outlet. Preferably, an electric fan is provided at the air outlet.

7 Claims, 6 Drawing Sheets

HEAT-RADIATION STRUCTURE OF ELECTRIC UNIT BOX

BACKGROUND OF THE INVENTION

1. Field of the Invention

This invention relates to a heat-radiation structure of an electronic-unit box in which the heat-radiation property of the electronic-unit box mounted on a vehicle or the like is improved.

2. Background

FIGS. 7 and 8 show a conventional electronic-unit box.

An electronic-unit box 41 is integrally formed with synthetic resin, such that a rectangular hollowed inner peripheral wall 44 is formed so as to project in the inside of a box body 42 so that an air layer 45 for insulation and heat radiation is formed between the inner peripheral wall 44 and an outer peripheral wall 43. An electronic unit 47 is mounted in an inside space 46 of the inner peripheral wall 44. The electronic-unit box 41 is mounted on a vehicle and the electronic-unit box 41 is closed with a cover 48. The electronic unit 47 is used, for example, for fuel injection control, or the like.

In the foregoing conventional structure, however, when the electronic-unit box 41 is mounted in an engine room or the like, the temperature of the air layer 45 may become saturated so that cooling of the electronic unit 47 becomes insufficient.

SUMMARY OF THE INVENTION

In the foregoing circumstances, an object of the present invention is to provide a heat-radiation structure of an electronic-unit box which can exhibit sufficient heat-radiation effects even in a place such as an engine room or the like where the overall temperature becomes high.

In order to achieve the foregoing object, according to an aspect of the present invention, a heat-radiation structure of an electronic-unit box in which an air layer is formed between a primary peripheral wall of the electronic-unit box and a secondary peripheral wall located inside the primary peripheral wall, and an electronic unit is received inside the secondary peripheral wall, in which an air intake and an air outlet are provided in a body of the box so as to communicate with the air layer, and air interrupting walls are provided in a shorter peripheral-distance-side flow path of the air layer between the air intake and the air outlet so that cooling air passes through a longer peripheral-distance-side flow path of the air layer from the air intake to the air outlet.

Preferably, an electric fan is provided at the air outlet.

DETAILED DESCRIPTION OF THE PREFERRED EMBODIMENTS

Preferred embodiments of the invention will be described below in detail with reference to the accompanying drawings.

Figure 1:
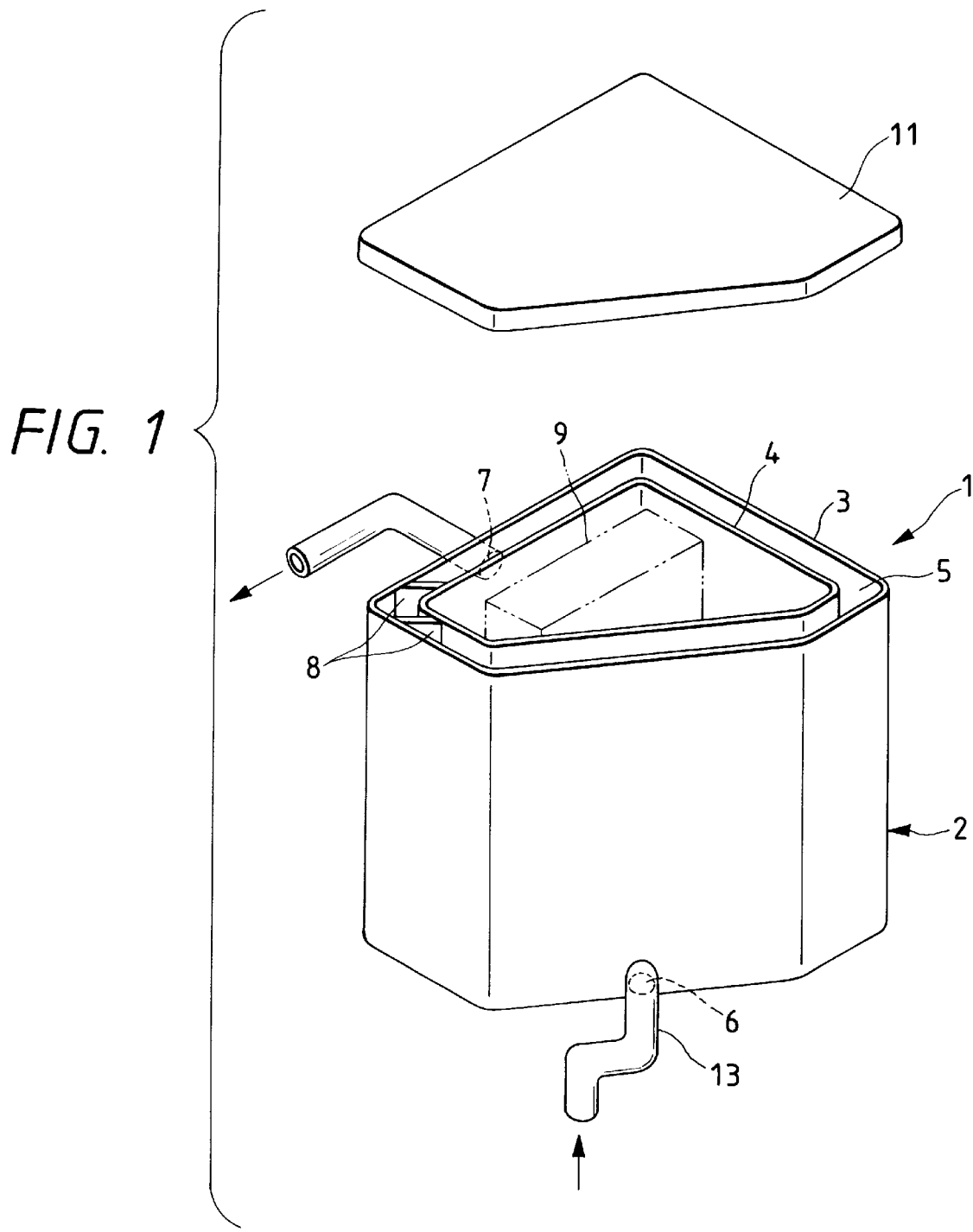
FIG. 1 is an exploded perspective view showing an embodiment of the heat-radiation structure of an electronic-unit box according to the present invention.
Figure 2:
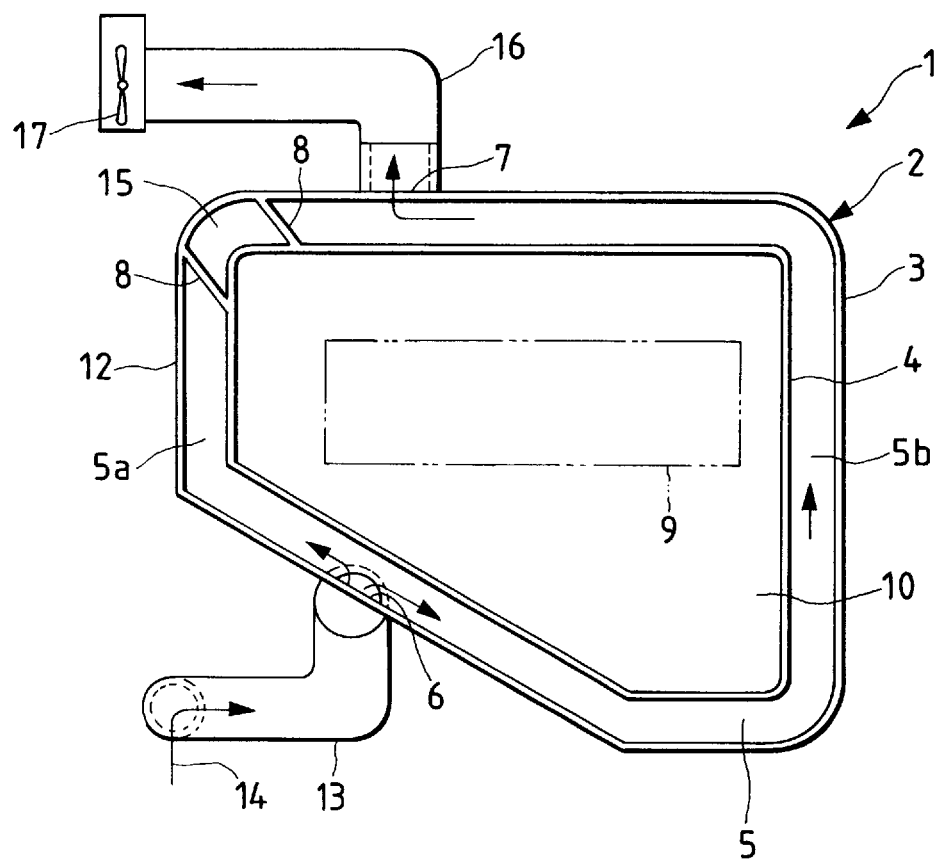
FIG. 2 is a plan showing the same embodiment.

FIGS. 1 and 2 show an embodiment of the heat-radiation structure of an electronic-unit box according to the present invention.

In this structure, an air layer (a flow path) 5 is formed between an outer peripheral wall (a primary peripheral wall) 3 and an inner peripheral wall (a second peripheral wall) 4 of a box body 2 of an electronic-unit box 1, and an air intake 6 and an air outlet 7 are provided in the outer peripheral wall 3 to communicate with the air layer 5. Further, air interrupting walls 8 are provided in an air layer portion 5a which is located on a shorter peripheral-distance-side of the air layer 5 between the air intake 6 and the air outlet 7 so that cooling air is made to pass (while making a detour) through an air layer portion 5b which is located on a longer peripheral-distance-side of the air layer 5 from the air intake 6 to the air outlet 7 by the air interrupting walls 8. In other words, the air interrupting walls 8 are located along the shorter of the flow paths, as measured between the air intake 6 and the air outlet 7, so that the flow of air between the inner 4 and outer 5 peripheral walls follows a longer route around the periphery of the box body 2 before exiting via the air outlet 7.

The box body 2 is formed integrally with synthetic resin so as to have a substantially trapezoidal external appearance, and the inner peripheral wall 4 is formed inside the outer peripheral wall 3 so as to be parallel with the outer peripheral wall 3 at a predetermined distance therebetween in the same manner as in the conventional example. An electronic unit 9 is received in an inside space 10 of the inner peripheral wall 4, and an upper portion of the box body 2 is covered with a synthetic-resin cover 11.

The air intake 6 is provided in a place near a shorter wall 12 of the box body 2 so as to extend from a lower portion to a bottom portion of the outer peripheral wall 3, and a duct 13 is formed to extend downward from the air intake 6. This prevents the cover 11 from flying away by excessive intake of air during operation of a vehicle.

Further, the air outlet 7 is provided so as to be in opposition to the air intake 6 and is formed in a place near the shorter wall 12 of the box body 2 and in an upper portion of the outer peripheral wall 3. Since the air intake 6 and the air outlet 7 are provided in the lower and upper portions of the box body 2 respectively, cold cooling air 14 is supplied from the lower side to absorb heat in the box 1 and then the heated air is discharged from the upper side so that cooling is efficiently performed.

The clockwise shorter flow path 5a and the counterclockwise longer flow path 5b are formed between the air intake 6 and the air outlet 7 as shown in FIG. 2, and the air interrupting walls 8 are formed in the shorter flow path 5a. The air interrupting walls 8 are formed on the shorter wall 12 side of the box body 2 near the air outlet 7. In this embodiment, a pair of air interrupting walls 8 are provided adjacent and in parallel to each other at a corner portion of the shorter wall 12 so as to bridge between the inner and outer peripheral walls 4 and 3. Between the pair of air interrupting walls 8 and 8 an air portion 15 is formed so that the cold air on the air intake 6 side and the hot air on the air outlet 7 side are insulated from each other by the air portion 15.

The cooling air 14 led from the air intake 6 into the air layer 5 through the duct 13 is prevented, by the air interrupting walls 8, from flowing into the air outlet 7 via the shorter flow path 5a. Therefore, the cooling air 14 makes a detour through the longer flow path 5b as described above to come into contact with substantially the whole surface of the inner peripheral wall 4 of the box body 2 to sufficiently absorb heat from the electronic unit 9 and is then discharged as hot air from the air outlet 7.

A duct 16 is provided at the air outlet 7, and an electric fan 17 is provided at the forward portion of the duct 16. The electric fan 17 compulsively discharges air out of the duct 16 as well as the air layer 5 so as to make the air flow efficiently in the air layer 5 in running of a vehicle and also in stoppage of the same. Moreover, it is possible to make the electric fan 17 rotate reversely to supply cooling wind into the air layer 5 through the duct 16.

Figure 3:
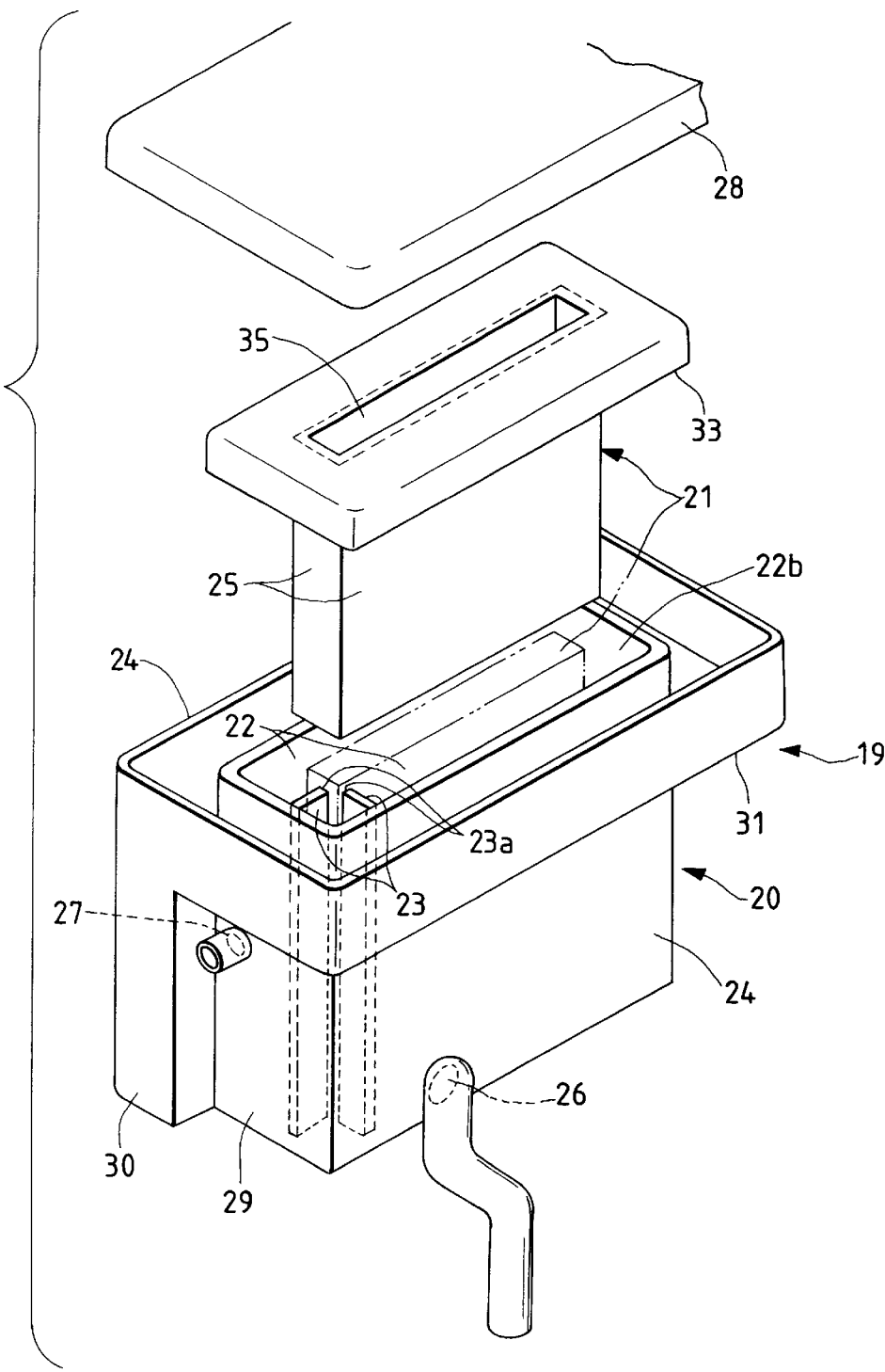
FIG. 3 is an exploded perspective view showing another example in which the heat-radiation structure is applied to another electronic-unit box.
Figure 4:
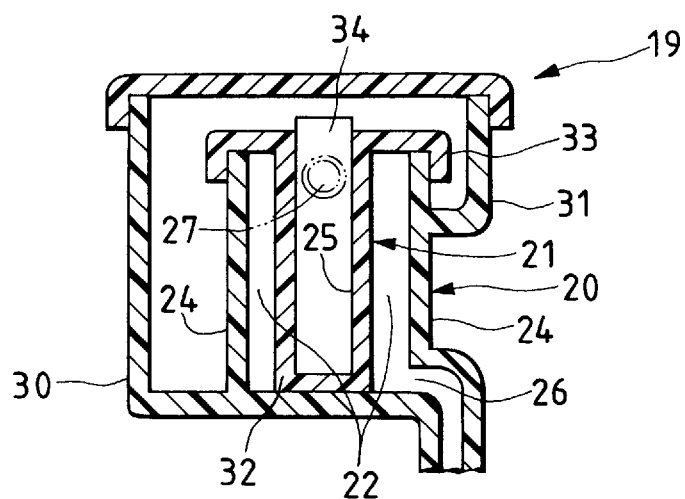
FIG. 4 is a vertically sectional view showing the same example.
Figure 5:
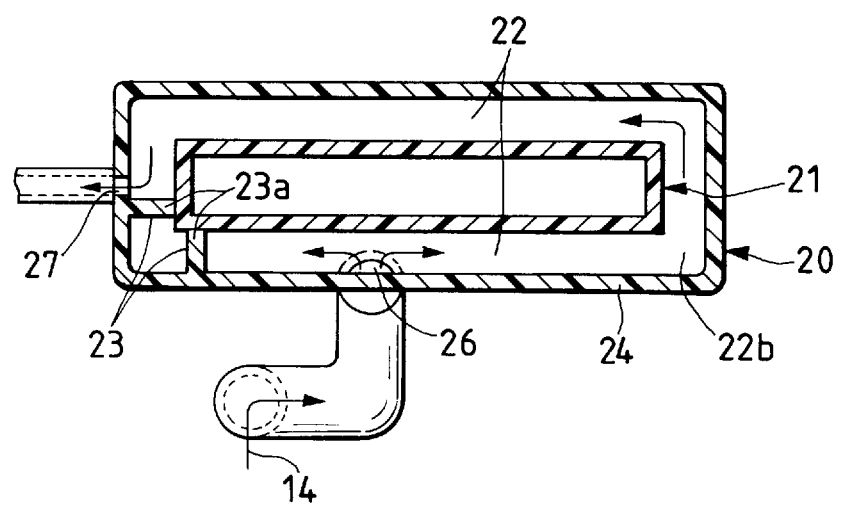
FIG. 5 is a cross section showing the same example.

FIGS. 3 to 5 show another embodiment in which the foregoing heat-radiation structure is applied to another electronic-unit box.

An electronic-unit box 19 includes a box body 20, a separate unit receiving casing 21, and a cover 28. The unit receiving casing 21 can be received in the inside of the box body 20 so that an air layer 22 is formed between the box body 20 and the unit receiving casing 21.

Air interrupting walls 23 are formed so as to project like ribs inside a peripheral wall (a primary peripheral wall) 24 of the box body 20. When the unit receiving casing 21 is inserted into the box body 20, front ends 23a of the air interrupting walls 23 come into close contact with a peripheral wall (a secondary peripheral wall) 25 of the unit receiving casing 21. As a result, the air layer 22 is interrupted by the air interrupting walls 23. An air intake 26 and an air outlet 27 are disposed on the opposite sides of the air interrupting walls 23 so as to be relatively close to each other and are made to communicate with each other through a longer flow path 22b of the air layer 22.

In this example, the box body 20 includes a case-like box main body portion 29 and a hood-like subsidiary body portion 30 which are integrally formed with each other. A flange portion 31 is formed on the peripheral wall 24 of the main body portion 29 so as to be integrally continuous to the subsidiary body portion 30, and a cover 28 is provided to cover the flange portion 31. The unit receiving casing 21 is received in the main body portion 29. The unit receiving casing 21 has a bottom portion 32 and a flange portion 33 which is fitted to the main body portion 29. An electronic unit 34 is inserted into an empty chamber 35 of the unit receiving casing 21. The unit receiving casing 21 is formed separately from the box body 20 to improve the resin molding property.

Figure 6:
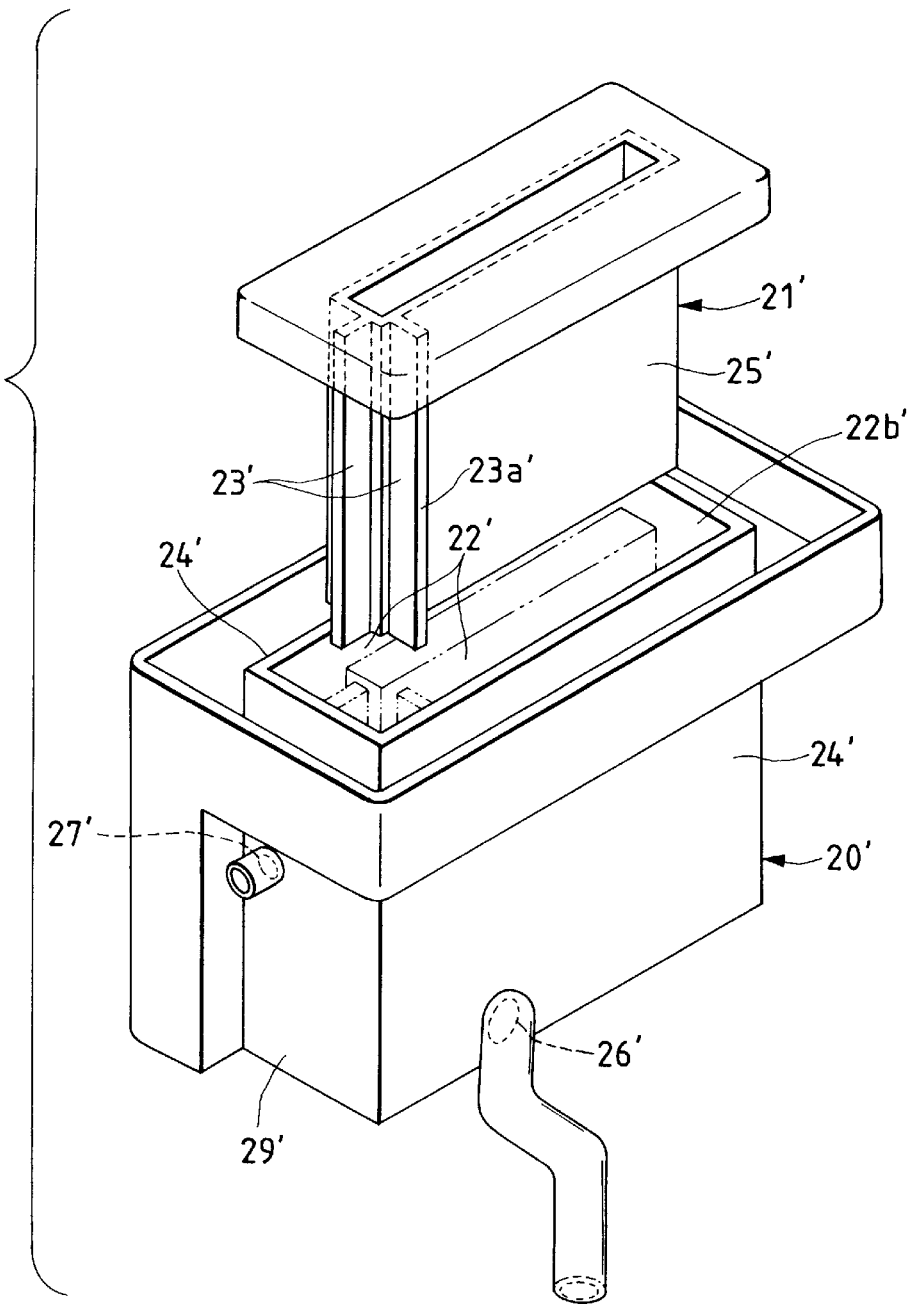
FIG. 6 is an exploded perspective view showing a modification of the heat-radiation structure.
Figure 7:
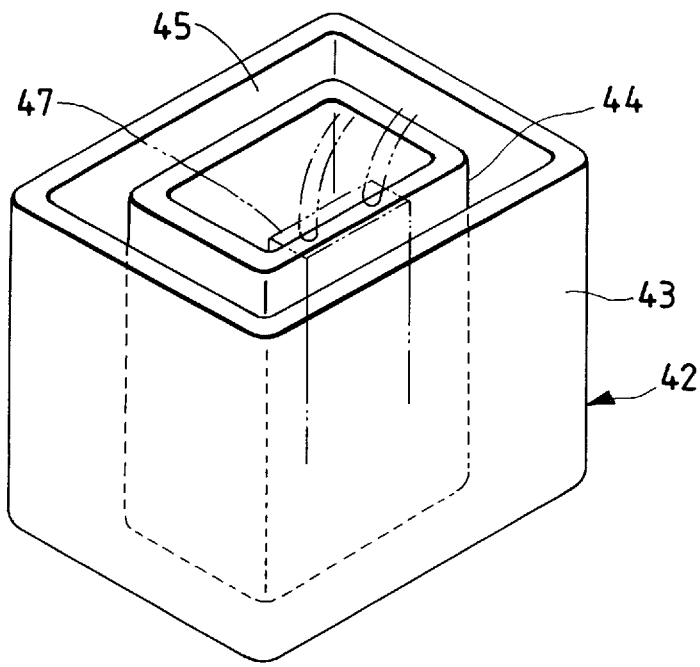
FIG. 7 is a perspective view showing a conventional example.
Figure 8:
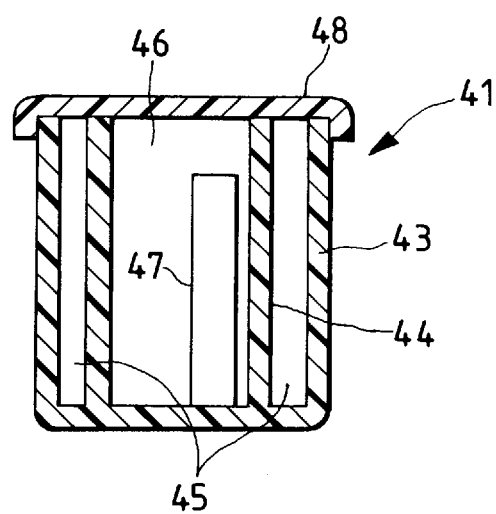
FIG. 8 is longitudinal sectional view showing the conventional example.

FIG. 6 shows an example in which air interrupting walls 23' are formed so as to project like ribs from a peripheral wall (a secondary peripheral wall) 25' of a unit receiving casing 21'. The unit receiving casing 21' is inserted into a box body 20' so that front ends 23a' of the air interrupting walls 23' come into close contact with an inner surface of a peripheral wall (a primary peripheral wall) 24' of a main body portion 29' of the box body 20'. A longer flow path 22b' is formed in an air layer 22' so as to make an air intake 26' and an air outlet 27' communicate with each other in the same manner as in the foregoing example. Since other configurations are the same as those of the foregoing example (FIGS. 3 and 4), explanation thereof is omitted here.

As described above, according to the present invention, cooling air is prevented, by the air interrupting walls, from flowing from the air intake to the air outlet via a shorter path so that cooling air is made to flow from the air intake to the air outlet while passing through the longer flow path of the air layer. Therefore, the electronic-unit box is cooled in a wide range to thereby increase the cooling efficiency. Further, according to the present invention, the cooling air in the air layer is compulsively discharged to the outside so that the cooling effect can be made higher. Thus, an electronic unit can be provided in any place, even in an engine room or the like, where the temperature becomes high.

What is claimed is:

1. A heat-radiation structure of an electronic-unit box, comprising:

a box body including a primary peripheral wall;

a secondary peripheral wall located inside said primary peripheral wall, wherein an air layer is formed between said primary peripheral wall and said secondary peripheral wall;

an electronic unit received in said secondary peripheral wall;

an air intake and an air outlet formed in said box body so as to communicate with said air layer so that said air layer forms into air flow paths between said air intake and said air outlet; and air interrupting walls formed to bridge between said primary and secondary peripheral walls and located in said air layer so as to be between said air intake and said air outlet in a shorter one of said air flow paths so that the flow of cooling air is blocked by said air interrupting walls and only passable through a longer one of said air flow paths of said air layer from said air intake to said air outlet.

2. The heat-radiation structure of claim 1, further comprising a first duct connected to said air intake to extend downward from said air intake.

3. The heat-radiation structure of claim 1, further comprising an electric fan provided at said air outlet.

4. The heat-radiation structure of claim 3, further comprising a second duct connected to said air outlet, wherein said electric fan is attached to one end of said second duct.

5. The heat-radiation structure of claim 1, wherein said air outlet is formed in a place near said air interrupting walls.

6. The heat-radiation structure of claim 1, further comprising a cover covering an upper portion of said box body.

7. The heat-radiation structure of claim 1, wherein an air interrupting layer is formed between said primary peripheral wall, said secondary peripheral wall and said air interrupting walls.

* * * * *